(12) United States Patent
Wei et al.

(10) Patent No.: US 9,659,928 B2
(45) Date of Patent: May 23, 2017

(54) SEMICONDUCTOR DEVICE HAVING A HIGH-K GATE DIELECTRIC ABOVE AN STI REGION

(71) Applicant: Advanced Micro Devices, Inc., Sunnyvale, CA (US)

(72) Inventors: Andy Wei, Dresden (DE); Roman Boschke, Dresdan (DE); Markus Forsberg, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 103 days.

(21) Appl. No.: 14/644,243

(22) Filed: Mar. 11, 2015

(65) Prior Publication Data
US 2015/0187765 A1    Jul. 2, 2015

Related U.S. Application Data

(62) Division of application No. 12/052,202, filed on Mar. 20, 2008, now Pat. No. 9,023,712.

(30) Foreign Application Priority Data

Aug. 31, 2007    (DE) ........................ 10 2007 041 206

(51) Int. Cl.
*H01L 29/49*  (2006.01)
*H01L 27/088* (2006.01)
(Continued)

(52) U.S. Cl.
CPC ...... *H01L 27/088* (2013.01); *H01L 21/76224* (2013.01); *H01L 21/82345* (2013.01); *H01L 21/823481* (2013.01); *H01L 21/823842* (2013.01); *H01L 21/823878* (2013.01); *H01L 23/528* (2013.01); *H01L 23/53271* (2013.01); *H01L 29/0653* (2013.01);
(Continued)

(58) Field of Classification Search
CPC  H01L 27/088; H01L 29/0653; H01L 29/4238
See application file for complete search history.

(56) References Cited

U.S. PATENT DOCUMENTS 6,034,393 A    3/2000  Sakamoto et al.
6,294,530 B1   9/2001  Zhang et al.
(Continued)

FOREIGN PATENT DOCUMENTS

EP    1892759 A2    2/2008

OTHER PUBLICATIONS

German Office Action with Translation corresponding to German Patent Application No. 10 2007 041 206.3, dated Nov. 18, 2013, 29 pages.
(Continued)

*Primary Examiner* — Michael Shingleton

(57) ABSTRACT

By forming a trench isolation structure after providing a high-k dielectric layer stack, direct contact of oxygen-containing insulating material of a top surface of the trench isolation structure with the high-k dielectric material in shared polylines may be avoided. This technique is self-aligned, thereby enabling further device scaling without requiring very tight lithography tolerances. After forming the trench isolation structure, the desired electrical connection across the trench isolation structure may be re-established by providing a further conductive material.

20 Claims, 6 Drawing Sheets

(51) Int. Cl.
*H01L 21/762* (2006.01)
*H01L 21/8234* (2006.01)
*H01L 21/8238* (2006.01)
*H01L 23/528* (2006.01)
*H01L 23/532* (2006.01)
*H01L 29/06* (2006.01)
*H01L 29/10* (2006.01)
*H01L 29/423* (2006.01)

(52) U.S. Cl.
CPC ...... *H01L 29/1079* (2013.01); *H01L 29/4238* (2013.01); *H01L 2924/0002* (2013.01); *Y10S 438/959* (2013.01); *Y10S 438/975* (2013.01)

(56) References Cited

U.S. PATENT DOCUMENTS

| | | |
|---|---|---|
| 6,696,724 B2 | 2/2004 | Verhaar |
| 6,720,610 B2 | 4/2004 | Iguchi |
| 6,791,142 B2 | 9/2004 | Tseng |
| 6,852,559 B2 | 2/2005 | Kwak et al. |
| 6,987,047 B2 | 1/2006 | Iguchi et al. |
| 7,247,535 B2 | 7/2007 | Jain |
| 7,382,016 B2 | 6/2008 | Matsui et al. |
| 7,768,047 B2 | 8/2010 | Mauritzson et al. |
| 7,781,824 B2 | 8/2010 | Yasuda |
| 7,956,406 B2 | 6/2011 | Yasuda |
| 7,973,353 B2 | 7/2011 | Huang et al. |
| 8,222,112 B2 | 7/2012 | Huang et al. |
| 2005/0035345 A1 | 2/2005 | Lin et al. |
| 2006/0043522 A1 | 3/2006 | Trivedi |
| 2006/0068575 A1 | 3/2006 | Gluschenkov et al. |
| 2007/0045699 A1 | 3/2007 | Liao et al. |
| 2007/0152271 A1 | 7/2007 | Dewey et al. |
| 2008/0171429 A1 | 7/2008 | Hatakeyama |

OTHER PUBLICATIONS

Translation of Official Communication from German Patent Application No. 10 2007 041 206.3, dated Jun. 26, 2008, 4 pages.

U.S. Appl. No. 12/052,202, filed Mar. 20, 2008, entitled "Method for Self-Aligned Removal of a High-K Gate Dielectric Above an STI Region".

SEMICONDUCTOR DEVICE HAVING A HIGH-K GATE DIELECTRIC ABOVE AN STI REGION

CROSS-REFERENCE TO RELATED APPLICATIONS

The present application is a divisional application of U.S. patent application Ser. No. 12/052,202, entitled "METHOD FOR SELF-ALIGNED REMOVAL OF A HIGH-K GATE DIELECTRIC ABOVE AN STI REGION" and filed on Mar. 20, 2008, the entirety of which is incorporated by reference herein.

BACKGROUND OF THE INVENTION

1. Field of the Invention

Generally, the present disclosure relates to the fabrication of highly sophisticated integrated circuits including highly scaled transistor elements comprising highly capacitive gate structures including a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine the performance of integrated circuits. Generally, a plurality of process technologies are currently practiced, wherein, for many types of complex circuitry, including field effect transistors, MOS technology is currently one of the most promising approaches, due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon, due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage, without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although generally high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range of 1-2 nm that may not be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed to connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, commonly the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, as will be explained in more detail with reference to FIGS. 1a-1c.

FIG. 1a schematically illustrates a cross-sectional view of a semiconductor device 100 comprising a substrate 101 having formed thereon a silicon layer 102, in which a first active region 102A and a second active region 102B are formed. The active regions 102A, 102B are to be understood as appropriately doped semiconductor regions for forming therein and thereon respective transistor elements having drain and source regions and a channel region. In the example shown in FIG. 1a, the first active region 102A may represent a lightly P-doped region so as to form therein one or more N-channel transistor elements. Similarly, the second active region 102B may represent a lightly N-doped region so as to receive one or more P-channel transistors. The first and second active regions 102A, 102B are laterally isolated from each other by a trench isolation structure 103, which may be comprised of an insulating material including a significant portion of silicon dioxide material. Furthermore, in the manufacturing stage shown, the device 100 further comprises a gate layer stack configured to provide enhanced capacitive coupling and conductivity, as previously explained. That is, the gate layer stack 110 comprises a high-k dielectric insulating material 111, which may be provided in the form of a hafnium-based or zirconium-based dielectric material, as previously explained, in order to obtain a significantly increased capacitance for a similar layer thickness compared to conventionally used silicon dioxide gate dielectrics. For example, in this manufacturing stage, the high-k dielectric layer 111 may be provided with a thickness of approximately 15-25 Å for highly sophisticated applications.

The layer stack 110 further comprises a metal-containing conductive material 112, such as a titanium-based material and the like, which may exhibit a significantly higher electrical conductivity compared to conventionally used polycrystalline silicon, also referred to as polysilicon. The metal-containing material layer 112 comprises a first portion 112A that is formed above the first active region 102A and has a first work function adjusted such that the Fermi level is appropriately located with respect to the band gap of the doped silicon material in the first active region 102A. Hence, for an N-channel transistor, the first portion 112A may have a Fermi level in the vicinity of the upper band gap edge, which may, for instance, be accomplished by providing the first portion 112A in the form of an alloy of a metal substantially comprising a second portion 112B, the characteristics of which are selected such that the work function of the second portion 112B is appropriate for the P-channel transistors to be formed in the second active region 102B. By appropriately selecting the respective work functions, the threshold voltage of the transistors to be formed in the first and second active regions 102A, 102B may be maintained at a low level, thereby providing the potential for enhancing the channel control on the basis of halo implantation processes, as previously explained.

Furthermore, the gate layer stack 110 further comprises a polysilicon layer 113 which may have any appropriate thickness in accordance with device requirements.

The semiconductor device 100 may be formed according to the following conventional process strategies. First, the trench isolation structures 103 may be formed on the basis of well-established techniques, including lithography, etch and deposition processes for forming a trench in the semiconductor layer 102 and subsequently filling the trench with a silicon dioxide-based material. Thereafter, appropriate implantation processes may be performed to define the first and second active regions 102A, 102B configured to enable the formation of N-channel transistors and P-channel transistors, respectively. Next, the high-k dielectric material may be formed on the basis of appropriate deposition techniques, wherein a layer thickness may be maintained within the above-specified range for sophisticated devices. Thereafter, the metal-containing layer 112 may be deposited, for instance, on the basis of chemical vapor deposition (CVD), physical vapor deposition (PVD) and the like. For example, in a first step, the layer 112 may be deposited as the first portion comprised of the material 112A, which may represent any appropriate metal alloy of a desired refractory metal and the like. Thereafter, the layer may be patterned to form the first portion 112A. Subsequently, the second portion 112B may be deposited and may be planarized, if required, to reduce the surface non-uniformity. Thereafter, the polysilicon layer 113 may be deposited as a final layer of the gate layer stack 110 in order to provide a highly stable surface of the gate layer stack 110 and also provide a high degree of compatibility with well-established gate patterning strategies, which are performed on the basis of polysilicon materials.

FIG. 1b schematically illustrates the semiconductor device 100 in a further advanced manufacturing stage wherein one or more gate electrode structures 120A, 120B, 120C are formed above the first and second active regions 102A, 102B, wherein at least one gate electrode structure 120B is provided as a common conductive line connecting a transistor element still to be formed in the first active region 102A with a transistor element still to be formed in the second active region 102B so that the gate electrode structure 120B extends across the trench isolation structure 103.

The gate electrode structures 120A, 120B, 120C may be formed on the basis of well-established lithography and sophisticated etch techniques, wherein appropriate etch chemistries may be used to efficiently etch through the polysilicon material of the layer 113 and the metal-containing portions 112A, 112B, as well as the high-k dielectric layer 111. Thereafter, any further processes may be performed to complete the respective transistor elements, such as forming drain and source regions on the basis of ion implantation and the like.

FIG. 1c schematically illustrates the device 100 during a high temperature treatment 131, which may be required during the process of forming respective transistor elements 130A, 130B, 130C and 130D. During the high temperature treatment 131, a significant oxygen diffusion may take place within the high-k dielectric material 111, wherein the oxygen diffusion may be fed by oxygen contained in the trench isolation structure 103 and in the metal-containing materials 112A, 112B, in particular in the alloy of the portion 112A. Since, for instance, hafnium- and zirconium-based oxides grow very fast due to the high affinity to oxygen diffusion even at moderately high temperatures, such as 700-800° C., a significant modification of the characteristics of the high-k dielectric material may be observed, for instance an increased layer thickness and thus a reduced dielectric constant, which may even further be pronounced at moderately high temperatures of approximately 950-1300° C., as may typically be used during activation treatments and the like.

In addition to a significant modification of the high-k dielectric material in the layer 111, also the work function of the metal-containing layer 112, in particular the alloy of the first portion 112A, may be shifted towards the center of the band gap thereby modifying the threshold voltage of the respective transistors 130A, 130B. Due to the high oxygen affinity of the high-k dielectric material of the layer 112, the trench isolation structure 103 may act as a source of oxygen, as indicated by arrows 132, which may then be redistributed via the high-k dielectric material into the alloy of the portion 112A, thereby shifting the work function and also providing additional oxygen at a corner 103A of the trench isolation structure 103. Consequently, additional insulating material may be grown within the active region 102A, that is, in the channel region of the transistor 130B at the corner 103A, thereby reducing the width thereof and therefore decreasing the drive current capability of this device, in particular if narrow channel transistors are considered. Thus, an increase of threshold voltage due to the metal work function shift, in combination with a loss of drive current owing to the increased thickness of the insulating material at the corner 103A, may render the conventional approach for integrating a high-k metal gate prior to transistor formation as described with reference to FIGS. 1a-1c less than desirable. However, a strategy in which the high-k dielectric material may be removed from the top of the trench isolation structure 103 may require a respective patterning regime including a highly complex lithography process followed by a respective etch process. During a respective lithography process, very strict overlay tolerances may have to be respected so as to align a respective etch mask precisely to the trench isolation structure 103. For sophisticated devices, corresponding overlay tolerances may be difficult to meet.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming highly scaled transistor devices on the basis of a high-k dielectric material while significantly reducing the negative effects of oxygen diffusion in "shared" gate lines by providing a self-aligned manufacturing strategy in which the high-k dielectric material may not be in contact with a top surface of a trench isolation structure. Consequently, the trench isolation structure may be formed on the basis of well-established materials, such as semiconductor oxides and the like, thereby providing a high degree of compatibility with conventional strategies, wherein the self-aligned nature of the process technique enables further device scaling without the necessity of respecting critical lithography tolerances. In this way, the approach of forming the high-k metal gate structure prior to performing high temperature treatments may be extended to future device generations. For this purpose, the trench isolation structure may be formed after providing the respective gate layer stack such that the high-k dielectric material may be removed at an area corresponding to the trench isolation structure in a self-aligned manner, thereby significantly reducing any contact of the high-k dielectric material with an oxygen-containing insulating material of the trench isolation structure. The "missing" electrical connection across the trench isolation structure may be provided after completing the trench isolation structure, thereby enabling the formation of shared gate structures while nevertheless reducing disadvantageous effects, such as work function shift and channel width reduction.

One illustrative method disclosed herein comprises forming a gate layer stack above a semiconductor layer, wherein the gate layer stack comprises a high-k dielectric layer and a metal-containing material formed on the high-k dielectric material. The method further comprises forming a trench isolation structure in the gate layer stack so as to extend into the semiconductor layer in order to isolate a first active region from a second active region. Moreover, the method comprises forming a first gate electrode of a first transistor above the first active region and a second gate electrode of a second transistor above the second active region.

Another illustrative method disclosed herein comprises forming a gate layer stack on a semiconductor layer, wherein the gate layer stack comprises a high-k dielectric material and covers a first active region and a second active region. The method further comprises forming a trench isolation structure in the gate layer stack and the semiconductor layer so as to isolate the first and second active regions from each other and to provide a first portion of the gate layer stack and a second portion of the gate layer stack. Additionally, a conductive connection is formed between the first and second portions above the trench isolation structure, a first transistor is formed in and above the first active region and a second transistor is formed in and above the second active region.

One illustrative semiconductor device disclosed herein comprises a first active region formed in a semiconductor layer and a second active region formed in the semiconductor layer. Furthermore, a trench isolation structure is positioned between the first and second active regions so as to laterally isolate the first and second active regions, wherein the trench isolation structure comprises an insulating oxide material having a top surface. Additionally, the semiconductor device comprises a conductive line formed above a portion of the first active region, a portion of the second active region and a portion of the trench isolation structure, wherein the conductive line comprises a high-k dielectric material formed on a surface of each of the portions of the first and second active regions and further comprises a conductive material that is in contact with the top surface of the trench isolation structure.

BRIEF DESCRIPTION OF THE DRAWINGS

The disclosure may be understood by reference to the following description taken in conjunction with the accompanying drawings, in which like reference numerals identify like elements, and in which.

Figure 1A:
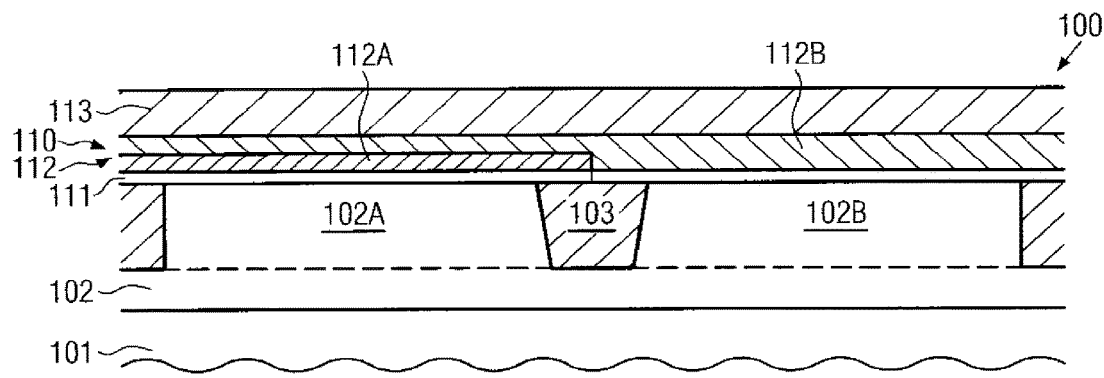
FIGS. 1a-1c schematically illustrate cross-sectional views of a semiconductor device including a sophisticated gate electrode structure based on a high-k dielectric material and a metal-containing material according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to methods and devices in which sophisticated gate electrode structures including a high-k dielectric material and a metal-containing conductive material may be formed with reduced modification even at highly problematic locations, such as trench isolation structures including an oxide-based insulating material, by avoiding a direct contact of the high-k dielectric material with a top surface of the trench isolation structure. To this end, a manufacturing strategy is provided in which the trench isolation structure is formed after forming the gate layer stack, thereby removing the high-k dielectric material precisely at a position corresponding to the trench isolation structure in a self-aligned manner. An electrical connection across the trench isolation structure may be provided subsequently by additionally forming a conductive material prior to actually patterning the gate electrode structures. Consequently, the gate electrode structures may be formed prior to actually defining the drain and source regions of the respective transistor elements, wherein any high temperature treatments, for instance required for activating dopants and re-crystallizing crystal damage, may have only a significantly reduced effect on the high-k dielectric material and the metal-containing gate material due to the reduced oxygen diffusion, which may conventionally be fed by increased surface portions that are in contact with the high-k dielectric material. Therefore, a high degree of work function stability may be maintained while channel width may also be substantially maintained, thereby rendering, in combination with the self-aligned nature of the process technique disclosed herein, the strategy for forming the high-k metal gate structure prior to the transistors as a viable technique for future device generations. Consequently, the devices and the techniques disclosed herein may be used for the formation of transistor elements having a gate length of approximately 40 nm and less, wherein the high-k dielectric material may provide the required high capacitive coupling from the gate electrode into the channel region on the basis of acceptable leakage currents, while the metal-containing gate material enhances conductivity and thus reduces signal propagation delay while also avoiding gate depletion as is the case in conventional polysilicon-based gate electrode structures. It should be appreciated that the embodiments disclosed herein are highly advantageous in the context of transistor elements having a gate length in the above-specified range, however, the principles disclosed herein may also be applied to less critical applications, thereby also enhancing performance of these devices. Therefore, the subject matter disclosed herein should not be considered as being restricted to any device dimensions unless such restrictions are specifically set forth in the specification and/or the appended claims.

Figure 2A:
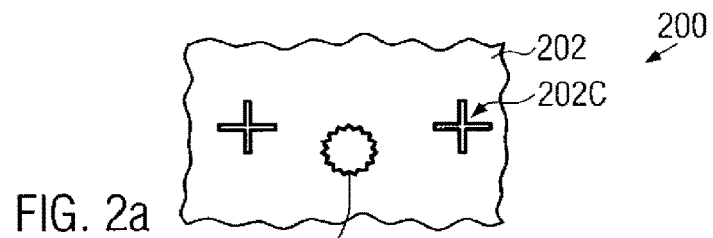
FIG. 2a schematically illustrates a top view of a portion of a semiconductor device during an early manufacturing stage according to illustrative embodiments disclosed herein.

FIG. 2a schematically illustrates a top view of a portion of a semiconductor device 200 at an early manufacturing stage. That is, the device 200 may comprise a substrate (not shown in FIG. 2a) and a semiconductor layer 202, which may be provided in the form of a silicon-based material, a germanium-containing silicon material or any other appropriate semiconductor material suitable for forming therein highly sophisticated transistor elements. In the manufacturing stage shown in FIG. 2a, the semiconductor layer 202 may comprise appropriate alignment marks 202C that are suitable for aligning a further material layer, such as a resist layer and the like, in a subsequent manufacturing stage. It should be appreciated that the alignment marks 202C may have any appropriate size and configuration so as to allow automated alignment procedures with appropriate overlay tolerances on the basis of available techniques. The alignment marks 202C may be formed on the basis of appropriate manufacturing techniques, for instance the alignment marks 202C may be formed by lithography and anisotropic etch techniques according to well-established strategies. Consequently, based on the alignment marks 202C, appropriate implantation masks may be formed above the semiconductor layer 202, which may then be used for defining respective regions in the semiconductor layer 202 so as to obtain a specified dopant concentration for defining active regions in the semiconductor layer 202.

Figure 2B:
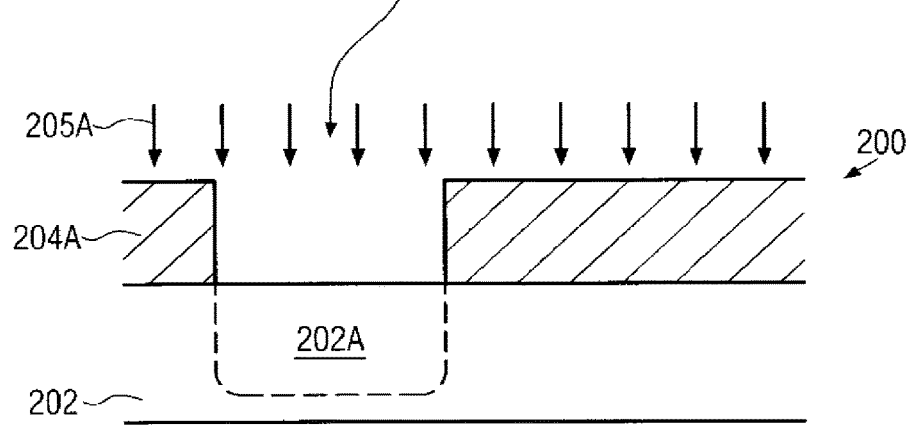
FIGS. 2b-2j schematically illustrate cross-sectional views of the semiconductor device of FIG. 2a during various manufacturing stages in forming a sophisticated gate layer stack and respective transistor elements by forming a trench isolation structure after forming the gate layer stack according to illustrative embodiments disclosed herein.

FIG. 2b schematically illustrates a cross-sectional view of the semiconductor 200 wherein it should be appreciated that the illustrated portion of the device 200 may be positioned within an area proximate the alignment marks 202C, and wherein the lateral dimensions of the area defined by the alignment marks 202C, one of which is usually provided at each corner of an exposure field or die, are significantly greater than respective lateral dimensions illustrated in the portion of the semiconductor device 200 as shown in FIG. 2b. That is, the area defined by the alignment marks 202C typically corresponds to the size of an exposure field of a respective lithography tool which may include one or several chip or die areas, each chip area typically including millions of transistor elements when sophisticated integrated circuits are considered. Thus, the device 200 as shown in FIG. 2b may correspond to a portion including several transistor elements, as will be explained later on. The device 200 may comprise a substrate 201, which may be provided in the form of any appropriate carrier material for forming thereon the semiconductor layer 202. For example, the substrate 201 may represent a bulk semiconductor substrate, such as a silicon substrate, an upper portion of which may represent the semiconductor layer 202. In other cases, the substrate 201 may have formed thereon an insulating material to provide an electrical isolation in the vertical direction for the semiconductor layer 202. In this case, the combination of the semiconductor layer 202 and the carrier material 201 including the insulating material may be referred to as a silicon-on-insulator (SOI) configuration, wherein the respective insulating material formed below the semiconductor layer 202 may be referred to as a buried insulating layer. In even further embodiments, a bulk configuration may be provided in specific substrate areas, while an SOI configuration may be used in other substrate areas. The techniques disclosed herein may not be restricted to any specific transistor configuration, such as a bulk configuration or an SOI configuration, unless set forth in the specific embodiments or the claims.

Furthermore, in this manufacturing stage, the device 200 may comprise an implantation mask 204A that is configured to expose a portion of the semiconductor layer 202 to an ion implantation process 205A to define a first active region 202A within the semiconductor layer 202. For example, the active region 202A, i.e., a region designed for forming therein one or more field effect transistor elements, may be doped with a P-dopant during the process 205A so as to establish an appropriate dopant concentration therein which may be suitable for the formation of N-channel transistors. In other cases, the active region 202A may be doped with an N-type dopant species, thereby enabling the formation of P-channel transistors.

The implantation mask 204A, which may be provided in the form of a resist mask, may be formed by well-established lithography techniques wherein the alignment marks 202C, previously described with reference to FIG. 2a, may be used for appropriately positioning the active region 202A within the semiconductor layer 202. It should be appreciated that the active region 202A may extend down to a buried insulating layer if an SOI configuration is considered.

Figure 2C:
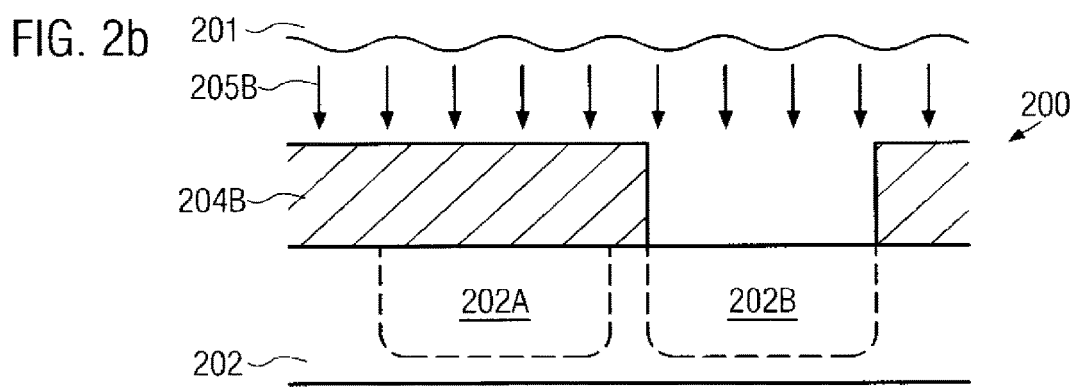

FIG. 2c schematically illustrates the semiconductor device 200 during a further implantation process 205B that is performed on the basis of a further implantation mask 204B, for instance a resist mask, in order to define a second active region 202B, which may be inversely doped with respect to the first active region 202A.

Figure 2D:
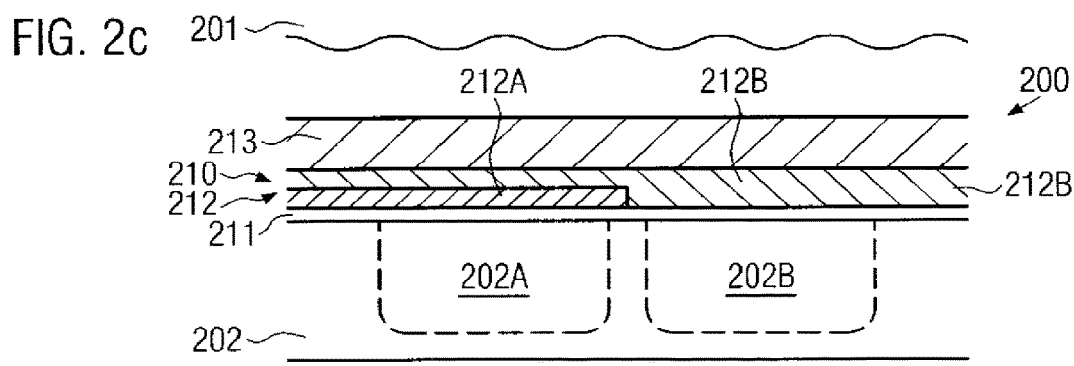

FIG. 2d schematically illustrates the semiconductor device 200 in a further advanced manufacturing stage. As shown, the device 200 may comprise a gate layer stack 210 that, in one illustrative embodiment, at least comprises a high-k dielectric material in the form of a layer 211 that is formed above the active regions 202A, 202B and, in some embodiments, is directly formed on the semiconductor material of the regions 202A, 202B, that is, the layer 211 is formed on the active regions 202A, 202B so as to form an interface therewith. The high-k dielectric material may be comprised of any appropriate material composition, as, for instance, specified above, wherein, for instance, hafnium-based materials, zirconium-based materials and the like may be used. In sophisticated applications, the layer 211 may have a thickness of approximately 15-25 Å, wherein, in less critical applications, greater thickness values may be used. The gate layer stack 210 may comprise a conductive layer 212 comprised of a metal-containing material which may exhibit an increased conductivity compared to a doped semiconductor material, such as doped polysilicon material and the like. For example, the metal-containing material 212 may comprise refractory metals, such as titanium, tantalum and the like, possibly in combination with other components, such as nitrogen, carbon and the like. The layer 212 may comprise a first portion 212A that is formed above the first active region 202A, while a second portion 212B may be formed above the second active region 202B.

In the embodiment shown, the second portion 212B may also be provided above the first portion 212A, while in other illustrative embodiments, the layer 211 may be comprised of the two portions 212A, 212B and may substantially not overlap with each other. For example, the portions 212A and 212B may be provided with substantially the same thickness so as to form a substantially continuous layer with respect to the thickness of the materials 212A, 212B with a substantially abrupt change in material characteristics between the first and second active region 202A, 202B. Furthermore, the work function of the metal-containing material 212A may be appropriately designed so as to determine an appropriate threshold voltage for transistor elements to be formed in the first active region 202A. Similarly, the work function of the metal-containing material 212B may be adjusted so as to obtain a desired threshold voltage for transistor elements to be formed in the second active region 202B. For example, in the embodiment shown, the active region 202A may represent a P-doped region so that the material 212A may be provided in the form of an alloy of a metal component also included in the material of the portion 212B, wherein the work function of the alloy 212A is designed to provide a desired threshold voltage for N-channel transistors. In illustrative cases, the portion 212A may be comprised of titanium nitride, while the portion 212B may be comprised of titanium, possibly comprising other ingredients, so as to fine-tune the work function to a value appropriate for the formation of P-channel transistors in the second active region 202A. A configuration as shown in FIG. 2d, i.e., the portion 212A comprising a metal alloy in combination with an overlying part of the portion 212B comprised of a highly conductive metal, may be advantageous with respect to the overall performance of gate electrode structures, since the portion 212A may be provided with a reduced thickness compared to the overlying material of the portion 212B, which provides a desired overall high conductivity.

Moreover, the gate layer stack 210 may comprise a conductive layer 213, which may be provided as a non-metal, for instance a semiconductor material such as polysilicon and the like. The thickness of the non-metal layer 213 may be selected on the basis of device requirements wherein, generally, the entire thickness or height of the gate layer stack 210 may be less compared to conventional polysilicon-based gate layer stacks due to the significantly increased conductivity provided by the metal-containing layer 212. On the other hand, the layer 213 may provide a high degree of compatibility with well-established process strategies for forming conventional gate structures, such as polysilicon gate electrodes. In other illustrative embodiments, the layer 213 may be omitted when the integrity of the gate layer stack during the further processing may be less critical. In other cases, the layer 213 may be provided with a reduced thickness compared to the metal-containing layer 212 so as to provide metal confinement and compatibility with established process techniques, while the electrical functionality is substantially provided by the layer 212.

The semiconductor device 200 as shown in FIG. 2d may be formed on the basis of substantially the same process techniques as previously described with reference to the gate layer stack 110. In other cases, the deposition of the layer 213 may be omitted or may be performed with a significantly reduced thickness, depending on the process and device requirements. In illustrative embodiments in which the portion 212A is formed first as a continuous layer, as previously described with reference to the device 100, a corresponding patterning regime may be performed on the basis of lithography techniques using the alignment marks 202C, as described above.

Figure 2E:
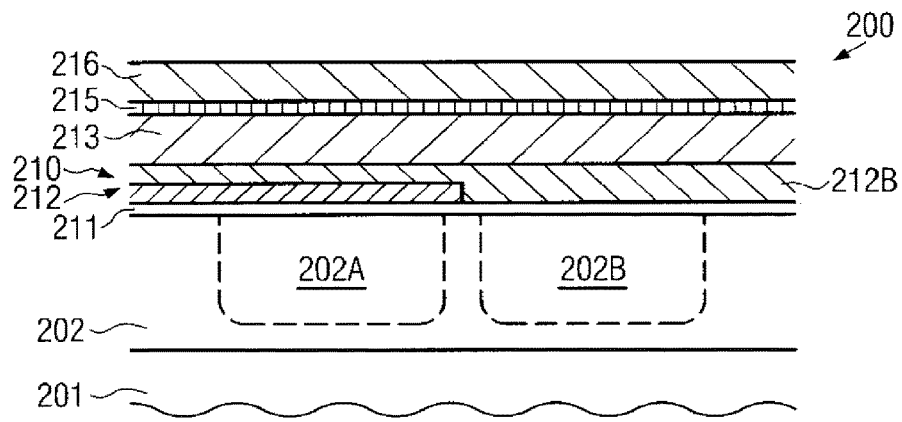

FIG. 2e schematically illustrates the semiconductor device 200 according to further illustrative embodiments in which a pad layer, such as a pad layer 216, may be formed above the gate layer stack 210. The pad layer 216 may be comprised of any appropriate material that is suitable for acting as a chemical mechanical polishing (CMP) stop layer in a later manufacturing stage. For instance, the pad layer 216 may be comprised of silicon nitride, while, in other cases, the pad layer 216 may be comprised of silicon dioxide or other appropriate materials. It should be appreciated that the pad layer 216 may be provided directly on the metal-containing layer 212, if the layer 213 is omitted, as previously explained. Furthermore, in other illustrative embodiments, as shown in FIG. 2e, an etch stop layer 215 may be used between the pad layer 216 and the gate layer stack 210, wherein the etch stop layer 215 may exhibit a significantly higher etch resistance compared to the pad layer 216 for a given etch recipe for removing the pad layer 216 in a later manufacturing stage. For example, the etch stop layer 215 may be comprised of silicon dioxide when the pad layer 216 is comprised of silicon nitride. In other cases, the etch stop layer 215 may be comprised of silicon nitride, while the pad layer 216 may be formed of silicon dioxide. However, any other appropriate material may be used for the layers 216, 215, such as silicon oxynitride, silicon carbide, nitrogen-enriched silicon carbide and the like, wherein respective material compositions may be selected so as to obtain the desired etch selectivity between the layers 215 and 216.

The layers 216 and 215 may be formed on the basis of well-established deposition techniques, such as CVD and/or oxidation, when, for instance, the etch stop layer 215 is provided in the form of an oxide material of the material of the layer 213.

Figure 1B:
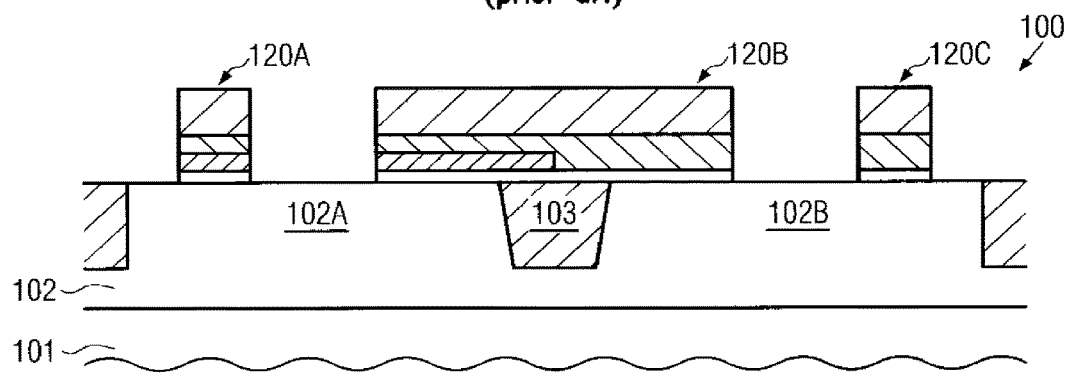
Figure 1C:
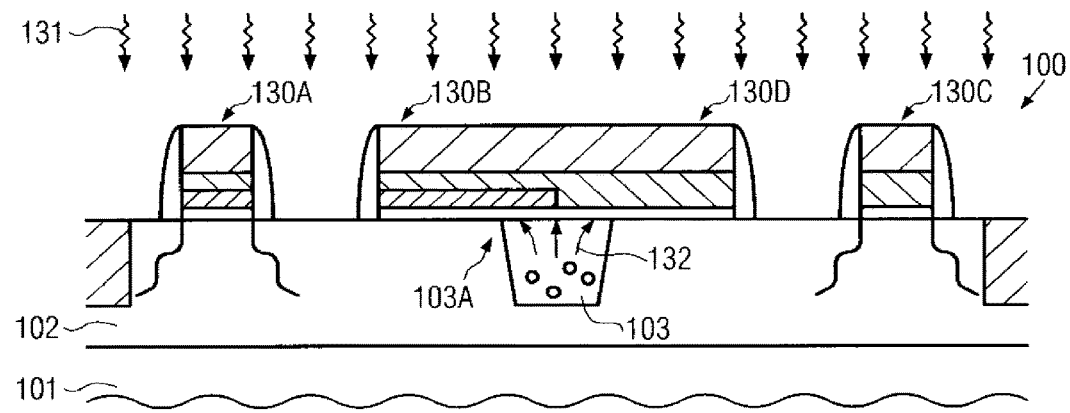
Figure 2F:
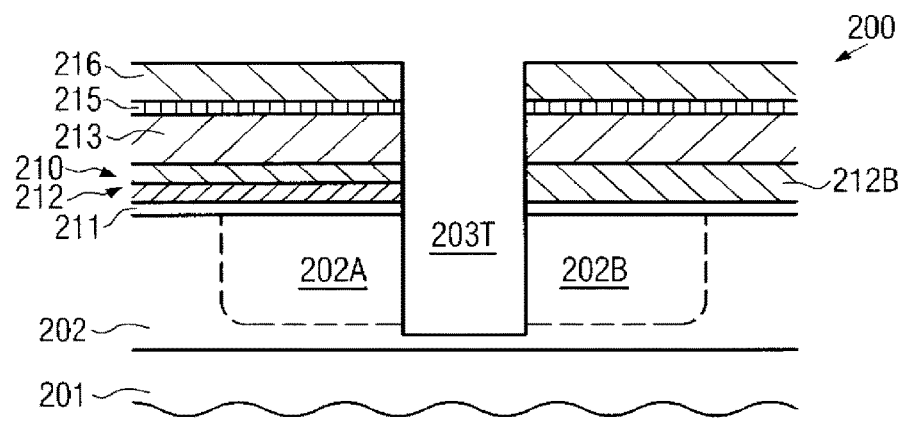

FIG. 2f schematically illustrates the semiconductor device 200 in a further advanced manufacturing stage in which a trench 203T is formed in the pad layer 216 and the etch stop layer 215, if provided, and in the gate layer stack 210 so as to extend into the semiconductor layer 202 down to a desired depth. It should be appreciated that the trench 203T may be formed with a lateral dimension, i.e., with a trench width as is required for the device 200 so as to laterally isolate the active regions 202A, 202B. Furthermore, the trench 203T may extend down beyond the depth of the active regions 202A, 202B wherein, in SOI configurations, the respective trench 203T may extend down to a respective buried insulating layer or may even extend into or through a corresponding buried insulating layer. The trench 203T may be formed on the basis of lithography and etch techniques, wherein appropriate recipes may be used which are well known for the materials used in the gate layer stack 210, the layers 215 and 216 and the semiconductor layer 202. For instance, well-established process techniques may be used and be correspondingly adapted as are also used for the formation of conventional shallow trench isolation (STI) structures, as is, for instance, shown in FIGS. 1a-1c. That is, during the patterning of respective trenches of conventional STI structures, similar materials may have to be etched, such as silicon nitride, silicon dioxide, silicon and the like, so that corresponding etch chemistries may be readily used during a corresponding etch process for forming the trench 203T. When etching through the metal-containing layer 212 and the dielectric layer 211, appropriate etch chemistries may be used which may also be employed during the patterning of the material 212A, as previously described.

Figure 2G:
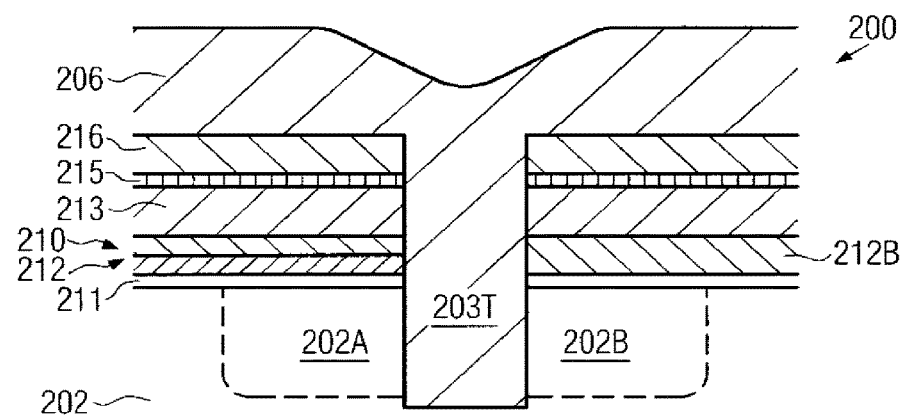

FIG. 2g schematically illustrates the semiconductor device 200 after filling the trench 203T with an insulating material, which, in some illustrative embodiments, is an oxide-based material, such as silicon dioxide and the like. For this purpose, a layer 206 of insulating material may be deposited on the basis of any appropriate deposition technique that provides a high gap filling capability so as to reliably fill the trench 203T. To this end, well-established deposition techniques for forming conventional STI structures, for instance based on silicon dioxide material, may be used with a minor adaptation to the increased aspect ratio of the trench 203T compared to a conventional strategy in which the isolation structure is formed prior to said deposition of the gate layer stack.

Figure 2H:
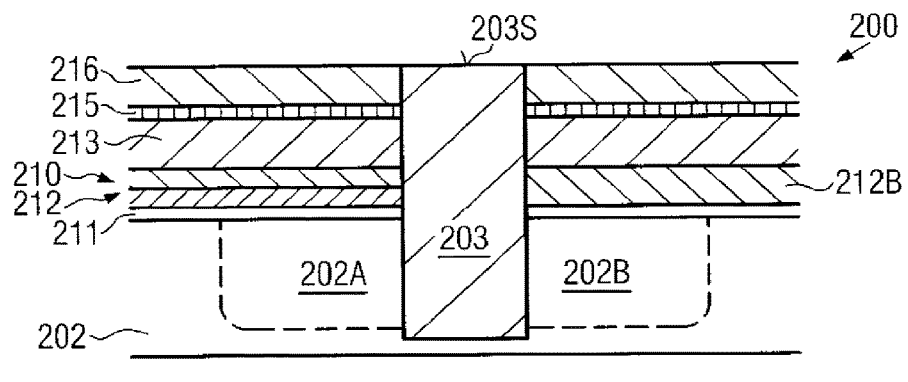

FIG. 2h schematically illustrates the semiconductor device 200 after planarizing the surface topography caused by the deposition of the layer 206. For example, any excess material of the layer 206 may be removed by CMP wherein appropriate process parameters, such as a type of slurry and other CMP parameters, may be selected such that a different removal rate may be obtained for the pad layer 216 and the material of the layer 206. Thus, the pad layer 216 may efficiently act as a CMP stop layer, thereby providing a high degree of process uniformity and reliability. As shown in FIG. 2h, after a corresponding CMP process, the trench isolation structure 203 may be provided, which extends with an upper surface 203S above the high-k dielectric layer 211.

It should be appreciated that in other illustrative embodiments the removal of the excess material of the layer 206 may be accomplished on the basis of an etch process, possibly in combination with an initial CMP process, wherein the pad layer 216 may be efficiently used as an etch stop layer, thereby enabling precise control of the respective etch process wherein the surface 203S may be positioned at any appropriate height level above the high-k dielectric layer 211. In still other illustrative embodiments, the pad layer 216 may be omitted while the etch stop layer 215 may provide the desired etch selectivity during a corresponding removal of the material 206 on the basis of an etch process, wherein an initial CMP process may provide a substantially planar surface topography. In still other illustrative embodiments, the pad layer 216 and the etch stop layer 215 may be omitted such that the layer 213 may act as a "stop" layer for controlling a corresponding process for removing excess material of the layer 206. For example, during a corresponding CMP process, the exposure of the layer 213 may be detected and may therefore be used for controlling the end of the corresponding CMP process. In other cases, prior to exposing the layer 213, the CMP process may be stopped and an etch process may be subsequently performed, wherein the layer 213 may act as an etch stop layer while also, in this case, the height level of the top surface 203S may be positioned appropriately above the height level of the layer 211. As previously explained, any material loss of the layer 213 may be less critical since the metal-containing layer 212 may provide the required overall conductivity of a gate electrode structure still to be formed on the basis of the gate layer stack 210.

In the embodiment shown in FIG. 2h, the pad layer 216 may be removed on the basis of a selective etch process, for instance based on hot phosphoric acid, when the pad layer 216 is comprised of silicon nitride. In other cases, any other appropriate etch chemistries may be used for removing the pad layer 216 selectively to the etch stop layer 215. Thereafter, the etch stop layer 215 may be removed selectively to the layer 213, thereby exposing the surface of the layer 213 for the further deposition of a conductive material, as will be explained with reference to FIG. 2i. In one illustrative embodiment, the etch stop layer 215 may be comprised of a silicon dioxide material, wherein the trench isolation structure 203 may also comprise silicon dioxide material, thereby enabling the removal of material from the trench isolation structure 203 in a highly controllable manner. Thus, during a corresponding selective etch process, which may, for instance, be based on hydrofluoric acid, the height level of the surface 203S may be lowered due to a controlled material removal of the trench isolation structure 203, while substantially no material of the layer 213 is removed. In this manner, a highly uniform process flow may be provided in which the removal of excess material of the layer 206, the removal of the pad layer 216 and the adjustment of the height level of the surface 203S may be accomplished with superior uniformity. In other illustrative embodiments, as described above, the height level of the surface 203S may be adjusted on the basis of CMP or etch processes, even without providing one or both layers 216, 215.

Figure 2I:
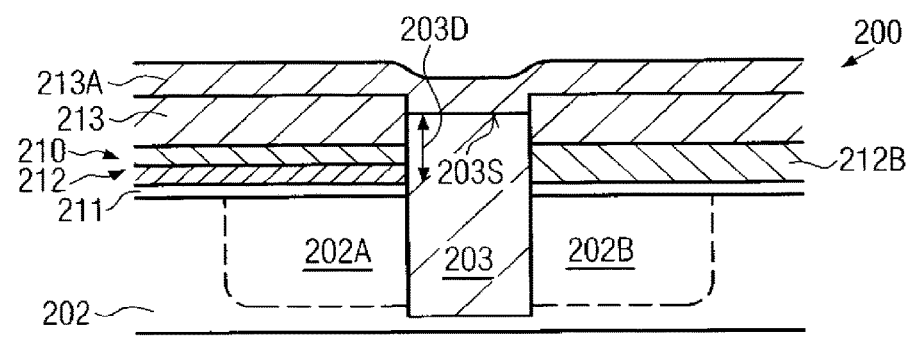

FIG. 2i schematically illustrates the semiconductor device 200 after the completion of the above-described process sequence. Thus, the top surface 203S of the trench isolation structure 203 may be lowered to any desired position while nevertheless providing a distance 203D to the high-k dielectric layer 211 so that a conductive connection of the gate layer stack 210 with one or both of the active regions 202A, 202B may be reliably avoided after electrical conductivity of the gate layer stack 210 is re-established across the trench isolation structure 203 by providing a further conductive material 213A connecting to the gate layer stack 210, for instance to the layer 213 above the first and second active regions 202A, 202B. In one illustrative embodiment, the conductive material 213A may be provided in the form of a non-metal material, such as a semiconductor material, for instance in the form of polysilicon. For example, the layer 213 may be provided with an initial thickness that is appropriately selected so as to obtain a desired total thickness after providing the conductive layer 213A in accordance with device requirements. Moreover, a degree of recessing the surface 203S may provide a certain amount of cross-sectional area of the conductive connection between the gate layer stack above the first active region 202A and the second active region 202B, even if a further planarization of the surface topography may be desired, for instance by performing a time-controlled CMP process. In other illustrative embodiments, the top surface 203S may not be substantially recessed so that a substantially planar surface topography may be obtained after the deposition of the conductive layer 213A. In other illustrative embodiments, the layer 213 may be provided with a reduced initial thickness or the layer 213 may be omitted during the formation of the gate layer stack 210, wherein the preceding processes may be controlled on any strategies as previously described so as to reliably maintain a distance 203D or substantially not recessing the surface 203B. In this case, the layer 213A may be formed to establish the desired electrical connection while also adjusting the final height of the gate layer stack 210.

Figure 2J:
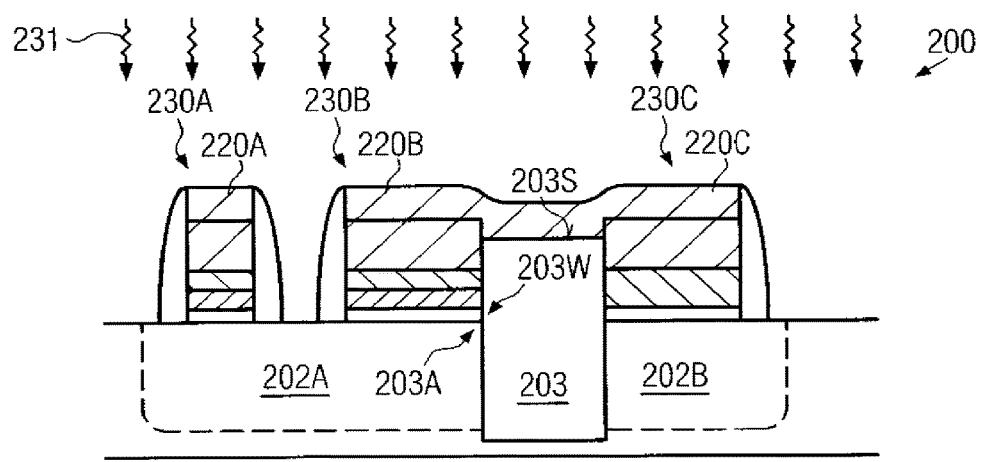

FIG. 2j schematically illustrates the semiconductor device 200 in a further advanced manufacturing stage. As shown, a plurality of gate electrode structures 220A, 220B and 220C may be formed on the basis of the gate layer stack 210 and the conductive layer 213A, wherein, for instance, a plurality of gate electrode structures 220A, 220B may be provided above the first active region 202A, which may, for instance, represent a region for forming N-channel transistors. Similarly, a gate electrode structure 220C may be formed above the second active region 202B and may be electrically connected to the gate electrode structure 220B. Thus, respective N-channel transistor elements 230A, 230B may be formed on the basis of the corresponding gate electrode structures 220A, 220B while a respective P-type transistor element 230C may be formed on the basis of the gate electrode structure 220C. During the manufacturing sequence for forming the transistor elements 230A, 230B, 230C, one or more treatments 231 on the basis of elevated temperatures may have to be performed, as previously explained, wherein, however, an oxygen diffusion from the trench isolation structure 203 into the high-k dielectric material of the layer 211 may be significantly reduced. That is, since the top surface 203S is not in contact with a high-k dielectric material, contrary to the conventional approach as previously described, the main path for oxygen diffusion is no longer available and hence a respective enrichment of the high-k dielectric material with oxygen may be significantly reduced, thereby substantially maintaining the work function of the portion 212A even if provided in the form of a metal alloy while also significantly reducing the formation of any additional dielectric material at the corner area 203A. Instead, only the cross-sectional area defined by the gate length of the structure 220 and the thickness of the layer 211, which may be in the range of 15-25 Å for sophisticated applications, may be available for oxygen diffusion at an interface 203W, thereby decreasing the available diffusion path by a factor determined by the ratio of the top surface 203S and the interface 203W compared to conventional strategies.

With reference to FIGS. 3a-3d, further illustrative embodiments will now be described in more detail in which, in addition to the self-aligned formation of a top surface of a trench isolation structure without contact to a high-k dielectric material, also relevant sidewall portions may be covered by an oxygen diffusion hampering material.

Figure 3A:
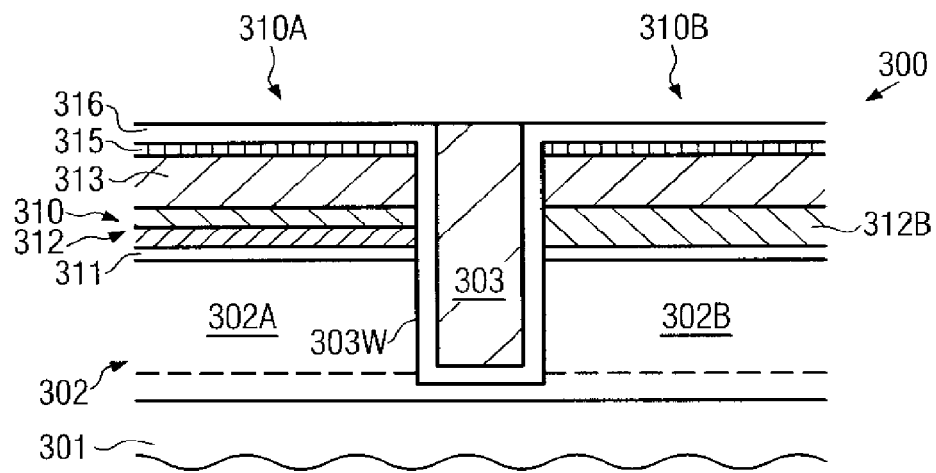
FIGS. 3a-3d schematically illustrate cross-sectional views of a semiconductor device during various manufacturing stages, wherein a trench for a trench isolation structure may be formed in a sophisticated gate layer stack based on an appropriate pad layer or liner, according to still further illustrative embodiments disclosed herein.

FIG. 3a schematically illustrates a cross-sectional view of a semiconductor device 300 comprising a substrate 301 having formed thereon a semiconductor layer 302. Furthermore, a first active region 302A and a second active region 302B are formed in the semiconductor layer 302. Moreover, a gate layer stack 310 is formed above the first and second active regions 302A, 302B but is separated into portions 310A, 310B by a trench isolation structure 303. The gate layer stack 310 may at least comprise a high-k dielectric material in the form of a layer 311 and may further comprise a first metal-containing material 312A in contact with the high-k dielectric layer 311 above the first active region 302A and a second metal-containing layer 312B in contact with the layer 311 above the second active region 302B. Furthermore, a further conductive layer 313 may be formed above the layer 312A, 312B and may have an electrical contact therewith. With respect to the components described so far, except for the trench isolation structure 303, the same criteria may be applied with respect to material composition and any manufacturing techniques for forming these components. The semiconductor device 300 may further comprise a pad layer 316, which may be comprised of an appropriate material for hindering or hampering oxygen diffusion therethrough, such as silicon nitride, silicon carbide, nitrogen-enriched silicon carbide and the like. In this manufacturing stage, the pad layer 316 may be formed above the gate layer stack 310 and on sidewalls 303W and a bottom portion of the trench isolation structure 303. In other illustrative embodiments, the pad layer 316 may not be formed on the bottom of the trench isolation structure 303 but may instead be provided as a "sidewall spacer." In one illustrative embodiment, additionally, an etch stop layer 315 may be formed between the pad layer 316 and the gate layer stack 310, while the layer 315 may not be formed on the sidewalls 303W, when comprised of an oxygen-containing material. For example, the etch stop layer 315 may be provided in the form of a silicon dioxide material and may therefore not be provided at the sidewalls 303W so as to avoid a direct contact of an oxygen-containing material with the high-k dielectric layer 311.

The semiconductor device 300 as shown in FIG. 3a may be formed on the basis of the following processes. After forming the gate layer stack 310 according to process techniques as previously described with reference to the device 200, in one illustrative embodiment, the etch stop layer 315 may be formed on the stack 310, if desired. Thereafter, respective lithography and etch processes may be performed to etch a trench into the layer 315, if provided, the gate layer stack 310 and the semiconductor layer 302. Next, the pad layer 316 may be formed, for instance on the basis of CVD techniques, thereby reliably covering the sidewalls 303W of the trench isolation structure. In some cases, the material of the pad layer 316 may be removed from horizontal device portions, such as the bottom of the trench isolation structure 303, by performing an anisotropic etch process if the presence of the materials of the pad layer 316 at the bottom of the trench isolation structure 303 or on other horizontal device portions is considered inappropriate. Thereafter, an oxide-based insulating material may be deposited, such as silicon dioxide, on the basis of well-established process techniques, thereby providing a high degree of compatibility with existing process techniques for forming shallow trench isolations. Thereafter, any excess material of the insulating material may be removed, for instance on the basis of a CMP process, as previously explained with reference to the device 200. During this removal process, the pad layer 316, if not removed during the previous anisotropic etch process, may act as an efficient CMP stop layer, as previously explained.

Figure 3B:
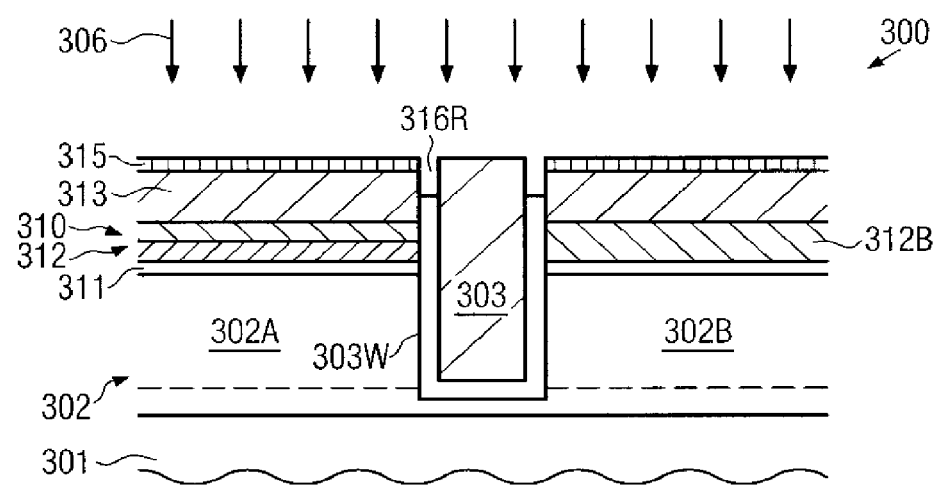

FIG. 3b schematically illustrates the device 300 during a selective etch process 306 for removing the pad layer 316 in a highly controllable manner, for instance on the basis of any appropriate selective etch chemistry, such as hot phosphoric acid, when the pad layer 316 is comprised of silicon nitride. During the etch process 306, a certain degree of recessing, indicated as 316R, of the layer 316 at the upper sidewall portions of the trench isolation structure 303 may occur, while nevertheless reliably maintaining the material 311 covered by the remaining material of the layer 316.

Figure 3C:
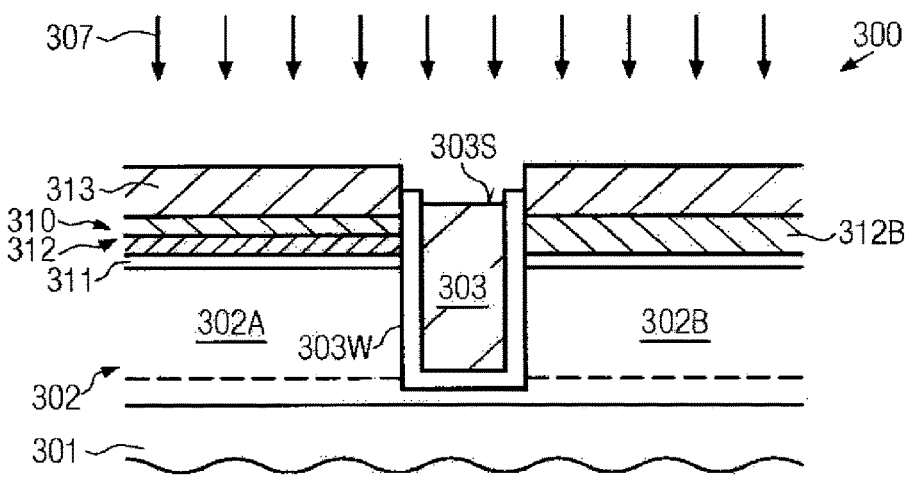

FIG. 3c schematically illustrates the device 300 during a further etch process 307 designed to remove the etch stop layer 315, if provided, and also to adjust the height level of the top surface 303S of the trench isolation structure 303. It should be appreciated that, due to the reliable coverage of the sidewalls 303W, a reduction of the height level of the top surface 303S is less critical and may even be intentionally reduced to any desired level so as to provide an increased cross-sectional area for a conductive material to be formed for connecting the gate layer stack positioned above the first and second active regions 302A, 302B.

Figure 3D:
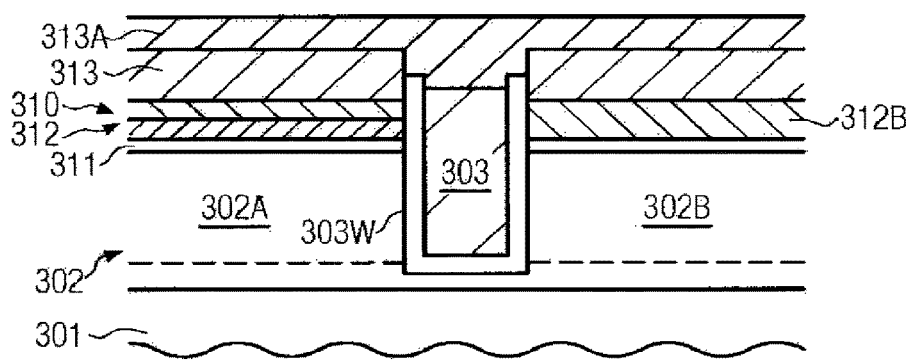

FIG. 3*d* schematically illustrates the device 300 after depositing a further conductive material 313A so as to connect to the gate layer stack 310 and also to the exposed surface 303S, thereby establishing a conductive connection between the portions 310A, 310B located above the first and second active regions 302A, 302B. Consequently, any diffusion from the oxide-based material of the structure 303 into the high-k dielectric material may be suppressed due to avoiding a direct deposition of the high-k dielectric material on the surface 303S, as previously explained, and additionally avoiding a direct contact of oxide-based material with the layer 311 at the sidewalls 303W of the structure 303. Thereafter, the further processing may be continued in a similar manner as described with reference to the devices 100 and 200, i.e., respective gate structures may be formed above the first and second active regions 302A, 302B, wherein a shared gate structure may be provided substantially without compromising the gate structure adjustment and the dielectric constant thereof.

Thereafter, respective transistor structures may be formed, as is shown and explained, for instance, with reference to transistors 130A, 130B, 103C, 130D (FIG. 1*c*).

As a result, the subject matter disclosed herein provides an enhanced technique for forming sophisticated gate electrode structures including a high-k dielectric material in combination with metal-containing gate material, wherein the gate electrode structures may be formed prior to performing high temperature treatments, such as anneal processes, typically used in forming drain and source regions of respective transistor elements. For this purpose, a direct contact of large surface areas of an oxygen-containing material of an isolation structure with the high-k dielectric material may be avoided, as is typically the case for shared polylines, thereby significantly reducing any deleterious effects created by the increased oxygen diffusion caused by the insulating material of the trench isolation structure. A direct contact of the high-k dielectric material with the top surface of the trench isolation structure may be avoided by forming the trench isolation structure after depositing the gate layer stack, thereby removing the high-k dielectric material at the area corresponding to the trench isolation structure in a self-aligned manner. Thus, the technique is scaleable with respect to future device generation while nevertheless providing a high degree of compatibility with conventional process strategies in forming STI structures and process strategies for forming high-k gate electrodes prior to forming the transistor drain and source regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a first active region formed in a semiconductor layer;
    a first gate electrode structure formed above said first active region;
    a second active region formed in said semiconductor layer;
    a second gate electrode structure formed above said second active region;
    a trench isolation structure positioned between said first and second gate electrode structures so as to electrically isolate said first and second gate electrode structures, said trench isolation structure comprising an insulating material having a top surface; and
    a conductive line formed above a portion of said first gate electrode structure, a portion of said second gate electrode structure and a portion of said trench isolation structure, said conductive line being conductively coupled to a top surface of each of the first and second gate electrode structures and in contact with said top surface of said trench isolation structure.

2. The semiconductor device of claim 1, wherein said conductive line comprises a first conductive metal-containing material formed above said first active region and a second conductive metal-containing material formed above said second active region, said first metal-containing material having a first work function differing from a second work function of said second metal-containing material.

3. The semiconductor device of claim 2, wherein said conductive line comprises a conductive semiconductor material formed on said first and second conductive metal-containing material, said conductive semiconductor material being in contact with said top surface of said trench isolation structure.

4. A semiconductor device comprising:
    a gate layer stack disposed above a semiconductor layer, said gate layer stack comprising a high-k dielectric layer and a metal-containing material disposed above said high-k dielectric layer;
    a trench isolation structure in said gate layer stack, said trench isolation structure extending through said gate layer stack and into said semiconductor layer to isolate a first active region from a second active region;
    a first gate electrode of a first transistor disposed above said first active region and a second gate electrode of a second transistor disposed above said second active region; and
    a conductive material disposed above said metal-containing material and directly overlying a top surface of said trench isolation structure, said conductive material forming an electrically conductive connection between said first gate electrode and said second gate electrode.

5. The semiconductor device of claim 4, wherein:
    said high-k dielectric layer includes said first and second active regions; and
    said metal-containing material comprises a first portion disposed above said first active region and a second portion disposed above said second active region, said first portion having a first work function differing from a second work function of said second portion.

6. The semiconductor device of claim 5, wherein said gate layer stack further comprises a conductive non-metal layer disposed above said metal-containing material.

7. The semiconductor device of claim 6, further comprising:
    a pad layer disposed above said metal-containing material.

8. The semiconductor device of claim 4, wherein said conductive material is a polysilicon material.

9. The semiconductor device of claim 4, wherein an upper end of said trench isolation structure extends at least partially into said conductive material above said metal-containing material and a lower end of said trench isolation structure extends at least partially into said semiconductor layer below said high-k dielectric layer.

10. A semiconductor device comprising:
a gate layer stack disposed above a semiconductor layer, said gate layer stack comprising a high-k dielectric material and covering a first active region and a second active region;
a trench isolation structure that extends through said gate layer stack and into said semiconductor layer so as to isolate said first and second active regions from each other and to provide a first portion of said gate layer stack and a second portion of said gate layer stack;
a conductive connection between said first and second portions of said gate layer stack above said trench isolation structure, said conductive connection directly overlying a top surface of the trench isolation structure; and
a first transistor in and above said first active region and a second transistor in and above said second active region.

11. The semiconductor device of claim 10, further comprising:
a first metal-containing material having a first work function disposed above said high-k material above said first active region; and
a second metal-containing material having a second work function disposed above said high-k material above said second active region, said first and second work functions differing from each other.

12. The semiconductor device of claim 11, wherein said gate layer stack further comprises a conductive material disposed above said first and second metal-containing materials.

13. The semiconductor device of claim 12, wherein said conductive material is a semiconductor material.

14. The semiconductor device of claim 12, wherein an upper end of said trench isolation structure extends at least partially into said conductive material above said first and second metal-containing materials and a lower end of said trench isolation structure extends at least partially into said semiconductor layer below said high-k dielectric material.

15. The semiconductor device of claim 10, further comprising:
a pad layer disposed above said gate layer stack.

16. The semiconductor device of claim 15, further comprising:
an etch stop layer disposed under the pad layer, said etch stop layer having a high etch resistance compared to said pad layer.

17. The semiconductor device of claim 10, wherein said conductive connection is formed of a semiconductor material.

18. The semiconductor device of claim 10, wherein:
said gate layer stack comprises a metal-containing material disposed above said high-k dielectric material; and
said trench isolation structure extends completely through said high-k dielectric material and said metal-containing material.

19. A semiconductor device comprising:
a gate layer stack disposed above a semiconductor layer, wherein said gate layer stack comprises a high-k dielectric material layer disposed above said semiconductor layer, a metal-containing material layer disposed above said high-k dielectric material layer, and a first conductive material layer disposed above said metal-containing material layer;
a trench isolation structure extending through said gate layer stack to isolate a first active region from a second active region, wherein an upper end of said trench isolation structure extends at least partially into said first conductive material layer above said metal-containing material layer and a lower end of said trench isolation structure extends at least partially into said semiconductor layer below said high-k dielectric material layer;
a first gate electrode of a second transistor disposed above said second active region from said gate layer stack;
a second gate electrode of a second transistor disposed above said second active region from said gate layer stack; and
a second conductive material layer disposed above said first conductive material layer and directly overlying a top surface of said trench isolation structure, said second conductive material layer forming an electrically conductive connection between said first gate electrode and said second gate electrode.

20. The semiconductor device of claim 19, further comprising:
a pad layer disposed above said gate layer stack.

* * * * *